US007111706B2

(12) United States Patent
Bourgoin

(10) Patent No.: US 7,111,706 B2
(45) Date of Patent: Sep. 26, 2006

(54) ENCLOSURE AND AUDIO-VISUAL APPARATUS COMPRISING SAME

(75) Inventor: Gilles Bourgoin, Angers (FR)

(73) Assignee: Thomson Licensing, Boulogne-Billancourt (FR)

( * ) Notice: Subject to any disclaimer, the term of this patent is extended or adjusted under 35 U.S.C. 154(b) by 3 days.

(21) Appl. No.: 10/470,146

(22) PCT Filed: Jan. 21, 2002

(86) PCT No.: PCT/FR02/00223

§ 371 (c)(1),
(2), (4) Date: Jul. 24, 2003

(87) PCT Pub. No.: WO02/060217

PCT Pub. Date: Aug. 1, 2002

(65) Prior Publication Data

US 2004/0055812 A1 Mar. 25, 2004

(30) Foreign Application Priority Data

Jan. 24, 2001 (FR) .................................. 01 00906

(51) Int. Cl.
*H05K 5/02* (2006.01)
*H04R 1/28* (2006.01)
*H04R 1/26* (2006.01)
*H04R 1/02* (2006.01)

(52) U.S. Cl. ...................... 181/156; 381/345; 381/349; 381/353; 381/354; 381/338

(58) Field of Classification Search ................ 181/156, 181/148, 199, 166, 160, 151, 146; 381/71.7, 381/345, 349, 350, 353, 354, 162, 338
See application file for complete search history.

(56) References Cited

U.S. PATENT DOCUMENTS 2,834,423 A * 5/1958 Bradford .................... 181/156
3,233,695 A * 2/1966 Hutchins .................... 181/156
3,319,737 A * 5/1967 Barthel ....................... 181/156
3,729,061 A * 4/1973 Tamura ...................... 181/146
4,213,515 A 7/1980 Laupman .................... 181/145
4,756,382 A * 7/1988 Hudson, III ................ 181/156
5,109,422 A * 4/1992 Furukawa ................... 181/199
5,150,417 A * 9/1992 Stahl .......................... 381/349
5,150,418 A * 9/1992 Honda et al. ............... 381/349
5,170,436 A * 12/1992 Powell ....................... 381/338
5,204,501 A * 4/1993 Tsao ........................... 181/156
5,327,985 A * 7/1994 Porzilli ....................... 181/199
5,333,204 A * 7/1994 Hamada et al. ............. 381/346
5,432,860 A * 7/1995 Kasajima et al. ........... 381/349

(Continued)

FOREIGN PATENT DOCUMENTS

DE 2727075 12/1978

(Continued)

OTHER PUBLICATIONS

Copy of Search Report dated Jun. 7, 2002.

*Primary Examiner*—Edgardo San Martin
(74) *Attorney, Agent, or Firm*—Joseph J. Laks; Harvey D. Fried; Richard LaPeruta

(57) ABSTRACT

The acoustic enclosure comprises a box, on which is mounted at least one electro-acoustic transducer, and a vent which together with the box produces a bass-reflex system with a specified bass-reflex resonant frequency. The vent comprises means of attenuation at the bass-reflex resonant frequency. Included is an audiovisual apparatus comprising a display device and such an enclosure.

6 Claims, 3 Drawing Sheets

U.S. PATENT DOCUMENTS

| | | | | | |
|---|---|---|---|---|---|
| 5,475,764 | A * | 12/1995 | Polk | | 381/338 |
| 5,602,367 | A * | 2/1997 | Meyer | | 181/156 |
| 5,659,155 | A | 8/1997 | Porzilli | | 181/0.5 |
| 5,809,154 | A * | 9/1998 | Polk | | 381/345 |
| 6,751,330 | B1 * | 6/2004 | Kowaki et al. | | 381/354 |

FOREIGN PATENT DOCUMENTS

| | | | |
|---|---|---|---|
| EP | 1041538 | A1 * | 10/2000 |
| FR | 2403706 | | 4/1979 |
| FR | 2623337 | A1 * | 11/1987 |

* cited by examiner

ENCLOSURE AND AUDIO-VISUAL APPARATUS COMPRISING SAME

This application claims the benefit, under 35 U.S.C. §365 of International Application PCT/FR02/00223 filed Jan. 21, 2002, which was published in accordance with PCT Article 21(2) on Aug. 1, 2002 in French and which claims the benefit of French patent application No. 0100906, filed Jan. 24, 2001.

BACKGROUND OF THE INVENTION

The present invention relates to acoustic enclosures and audiovisual apparatus comprising same.

It is known for an acoustic enclosure comprising at least one electro-acoustic transducer, such as a loudspeaker, mounted in a box, to be provided with a vent. Such an enclosure is generally dubbed a bass-reflex enclosure or ventilated enclosure. The unit constituted by the volume of the box and the vent reacts to the vibratory excitations of the loudspeaker like an oscillating system (Helmholtz resonator), with a resonant frequency $F_0$ referred to as the bass-reflex resonant frequency. The frequency response of the bass-reflex enclosure can thus be tailored to the desired use.

The use of a bass-reflex enclosure is in particular known in audiovisual apparatus, such as televisions, as described, for example, in utility model JP 63-183 788.

An example of frequency responses in the case of an unvented enclosure (dotted line) and in the case of a vented enclosure (continuous line) is given in FIG. 1 in which the resonant peak $F_0$ in the case of the vented enclosure is clearly apparent.

SUMMARY OF THE INVENTION

The inventor has noted that, in certain applications, in particular when using loudspeakers with hard suspension (made of foam or paper for example), the resonant peak could be too pronounced whereas the flattest possible response is generally desirable.

In order to improve the acoustic response of the bass-reflex enclosure, the inventor thus proposes that the vent comprise means of attenuation at the bass-reflex resonance.

According to other advantageous characteristics, the vent comprises at least one flexible plate:

the vent comprises at least one plate whose mechanical resonant frequency is close to the bass-reflex resonance;

the vent comprises at least one plate whose mechanical resonant frequency is practically equal to the bass-reflex resonant frequency;

the vent comprises two flexible plates which define a vent volume opening into an aperture of the box;

the electro-acoustic transducer is a loudspeaker with hard suspension.

BRIEF DESCRIPTION OF THE DRAWINGS

The invention also proposes an audiovisual apparatus which comprises a display device and such an enclosure.

The description which follows will be given with reference to the appended drawings in which.

DETAILED DESCRIPTION OF THE INVENTION

Figure 1:
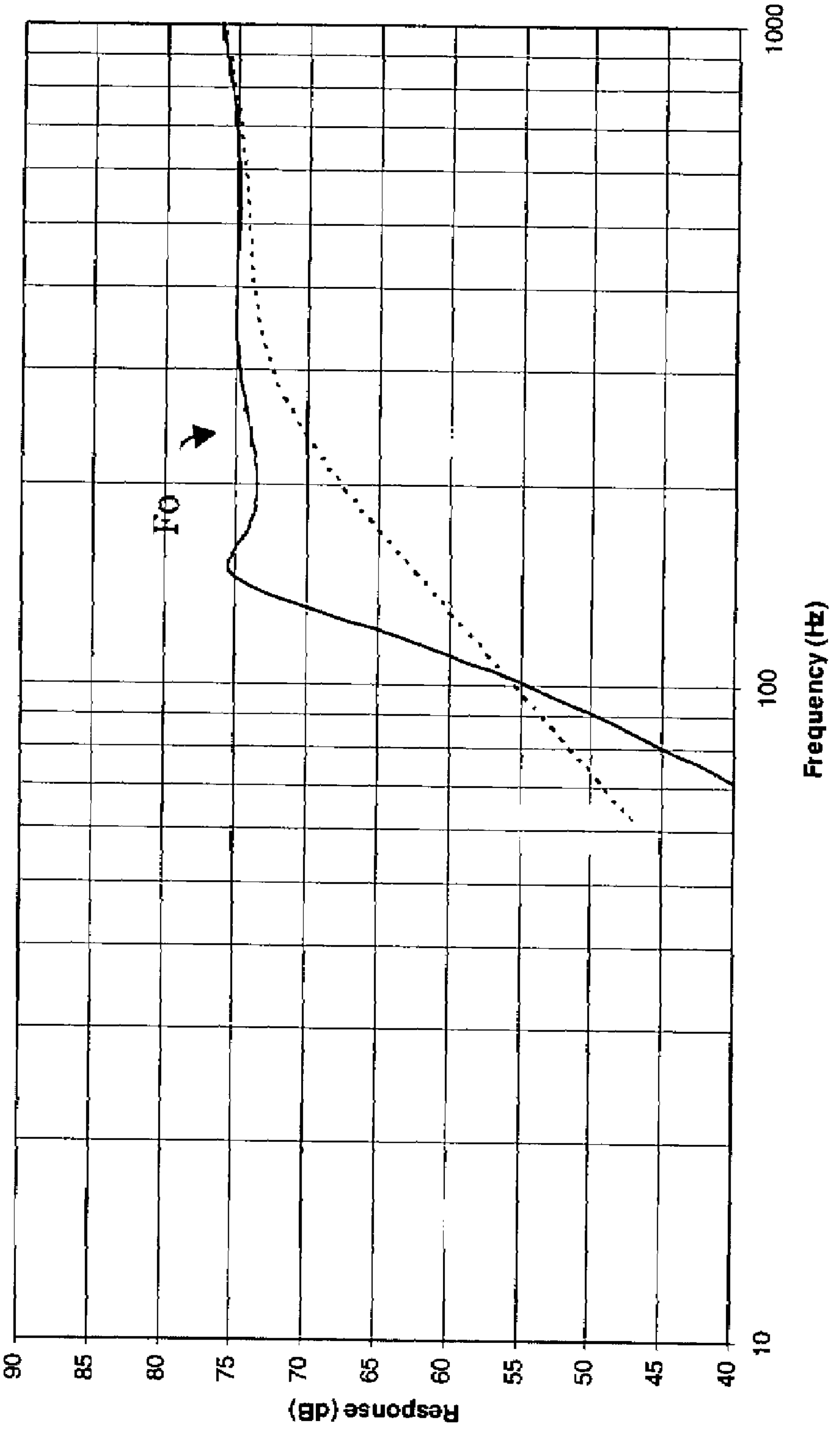
FIG. 1 represents the frequency responses of known systems, as already explained hereinabove.
Figure 2:
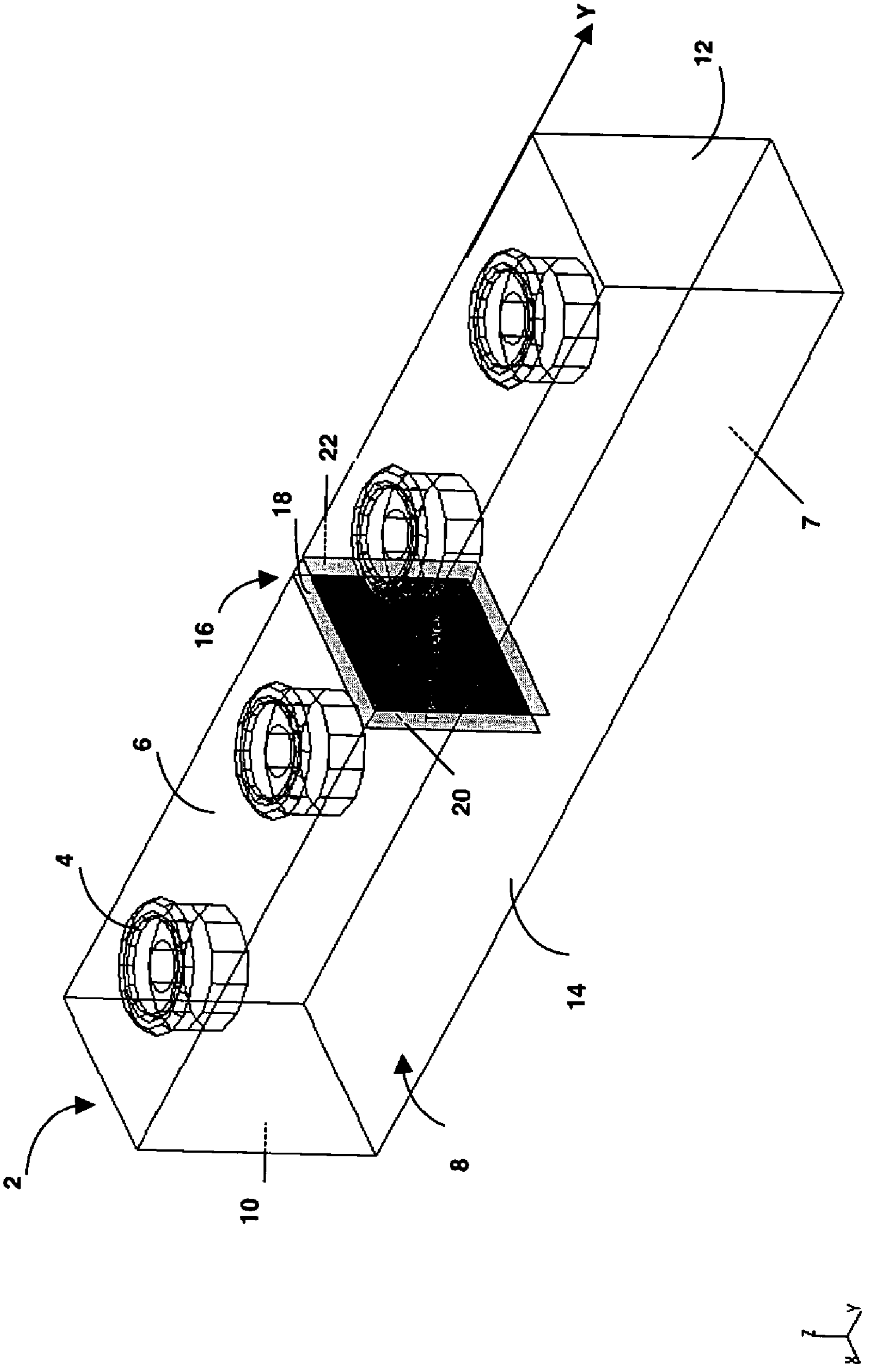
FIG. 2 represents an acoustic enclosure embodied in accordance with the teachings of the invention.

The enclosure 2 represented in FIG. 2 comprises four loudspeakers 4 mounted on the front face 6 of a parallelepipedal box 8 whose walls are made of wood. The loudspeakers 4 are aligned on the front face 6 of the box 8 in a general direction Y. The box possesses an upper face 10 and a lower face 12 that are parallel to one another and each perpendicular to the direction Y. The box also comprises a rear face 7 parallel to the front face and two lateral faces 14.

The loudspeakers are of the Odyssey type 1 with foam suspension.

The dimensions of the box 8 in the example studied are the following: height 250 mm (between upper face 10 and lower face 12); width 43 mm (between lateral faces 14); depth 55 mm (between front face 6 and rear face 7).

The enclosure 2 also comprises a vent 16 consisting of a rectangle aperture 18 in the front face 6 as well as of an upper plate 20 and of a lower plate 22 which are parallel to the upper 10 and lower 12 faces. The aperture 18 is not necessarily rectangular; it could as a variant be oblong.

The lower 22 and upper 20 plates do not extend over the entire depth of the box 8 (that is to say their surface area is less than that of the lower 12 and upper 10 faces). In the example, it extends over 40 mm. Of course, as a variant, the plates may have mutually differing lengths. Neither are they necessarily rectangular nor perfectly planar. The lower 22 and upper 20 plates are spaced 5 mm apart and thus define between themselves a vent volume which opens out on the one hand into the exterior of the box 8 through the aperture 18 and on the other hand into the interior of the box.

The lower 22 and upper 20 plates extend over the entire width of the front face so that the vent volume is also delimited by the lateral faces 14.

Such a unit constitutes a bass-reflex enclosure 2 having a resonant frequency $F_0$ of 155 Hz.

The lower 22 and upper 20 plates each have a lower rigidity than the walls of the box 8. In the example studied, the plates 20, 22 are made from HIPS (high impact polystyrene) of thickness 0.17 mm.

These plates 20, 22 behave like vibrating flexible plates and are designed in such a way that their mechanical resonant frequency $F_M$ is close to the resonant frequency $F_0$ of the bass-reflex enclosure 2.

In the example, the plates 20, 22 have a mechanical resonant frequency $F_M$ of 153 Hz.

To characterize the flexibility of a rectangular plate, one considers the frequency of the first natural mode of vibration of the same plate built in at its four sides, which frequency is given by the following theoretical relation:

$$F_v = \frac{35{,}99}{2\pi}\cdot\sqrt{\frac{D\cdot\left(\frac{3}{a^4}+\frac{2}{a^2\cdot b^2}+\frac{3}{b^4}\right)}{8\cdot\rho\cdot h}}$$

where D is the plate stiffness factor defined as follows:

$$D = \frac{E \cdot h^3}{12 \cdot (1 - \mu^2)},$$

h the thickness of the plate, a and b the dimensions of the sides of the rectangle formed by the plate; p the density, E the Young's modulus and μ the Poisson's ratio of the material. In the case of HIPS, E=2.1 $10^9$ $N.m^{-2}$, μ=0.3, ρ=1050 $kg.m^{-3}$.

In the application considered (acoustic enclosure, in particular for display devices), the plate is considered to be flexible for frequency values of the first natural mode $F_v$ which are below 800 Hz, preferably below 500 Hz. In the example described here, $F_v$=243 Hz.

By choosing the mechanical resonance $F_M$ to be close to (preferably practically equal to) the bass-reflex resonant frequency, the plates 20, 22 produce an attenuation and limit the influence of the vent around the bass-reflex resonant frequency $F_0$ without changing the value thereof, by partly absorbing the vibrations whose frequency is close to the mechanical resonant frequency $F_M$.

Figure 3:
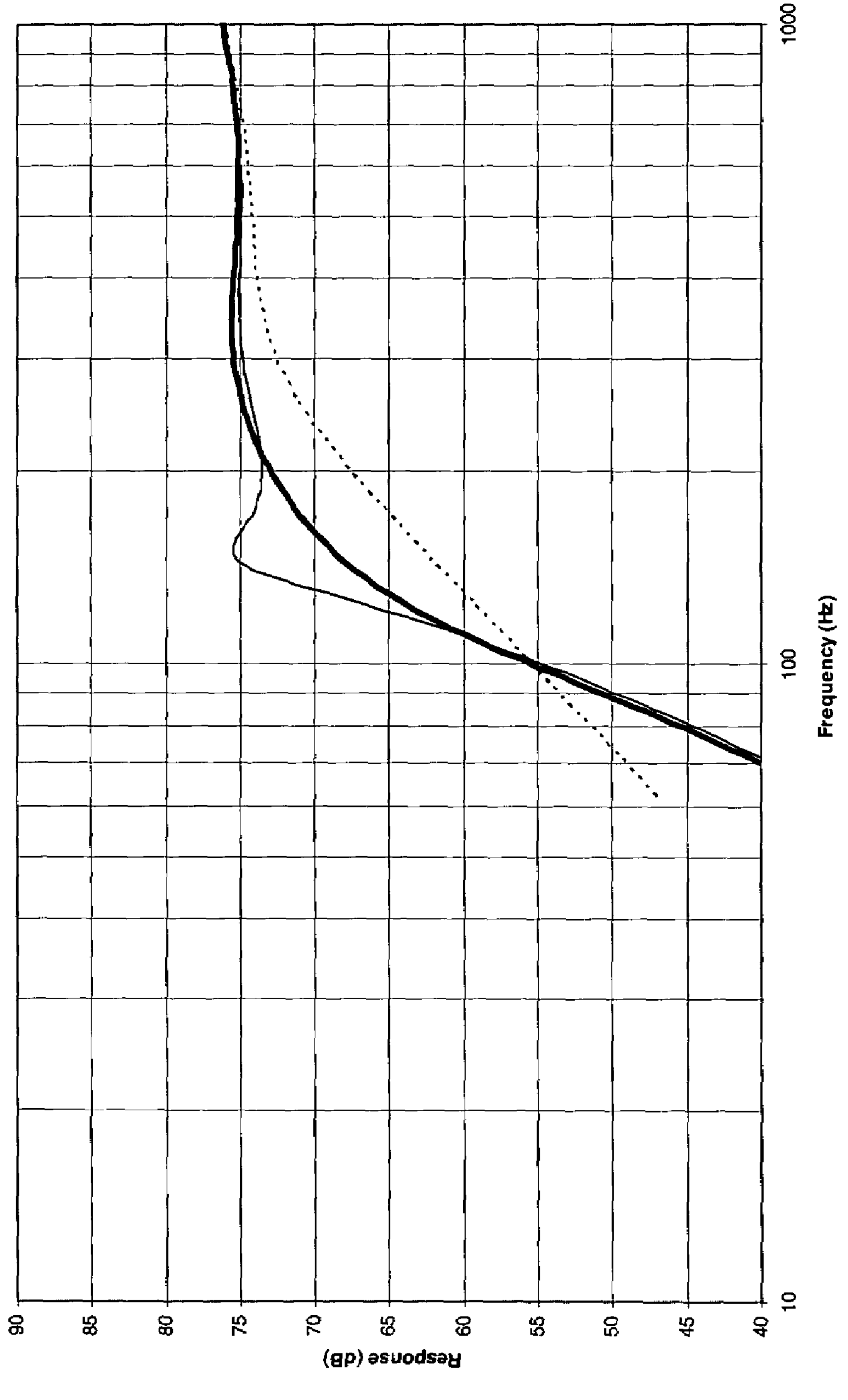
FIG. 3 represents the frequency response of the acoustic enclosure of FIG. 2 compared with the frequency responses of FIG. 1.

As is clearly visible in FIG. 3, the bass-reflex enclosure 2 therefore has an improved bass frequency acoustic response (thick continuous line) as compared with an unvented box (dotted line) without however exhibiting the overly sharp resonant peak of a conventional bass-reflex enclosure (thin continuous line).

As a variant, just one of the plates may be produced with a lower rigidity than the walls of the box 8, the other plate being for example produced in an identical manner to the walls of the box. The dimensioning of the plate of lower rigidity would therefore be designed in such a way that the vent constitutes a mechanical system having a mechanical resonant frequency $F_M$ close to the bass-reflex resonant frequency $F_0$ and thus produces a means of attenuation around the bass-reflex resonant frequency, and hence in particular at the bass-reflex resonant frequency.

In the preferred example explained hereinabove, the mechanical resonant frequency is very close to (substantially equal to) the bass-reflex resonant frequency. It is important to note however that the invention is not limited to this specific case but consists in providing means of attenuation which cover in particular the bass-reflex resonant frequency.

To determine the proximity of the two frequencies, reference may be made to conventional criteria: for example, the −3 dB cutoff frequency may be regarded as close to the resonant frequency.

The invention claimed is:

1. An acoustic enclosure comprising a box, on which is mounted at least one electro-acoustic transducer, and a vent which together with the box produces a bass-reflex system with a specified bass-reflex resonant frequency, wherein the vent comprises an aperture and means of attenuation at said bass-reflex resonant frequency, the vent including at least one flexible plate.

2. The enclosure as claimed in claim 1, wherein the vent comprises at least one plate whose mechanical resonant frequency is close to the bass-reflex resonance.

3. The enclosure as claimed in claim 1, wherein the vent comprises at least one plate whose mechanical resonant frequency is practically equal to the bass-reflex resonant frequency.

4. The enclosure as claimed in claim 1, wherein that the vent comprises two flexible plates which define a vent volume opening into an aperture of the box.

5. The enclosure as claimed in claim 1, wherein the electro-acoustic transducer is a loudspeaker with hard suspension.

6. An audiovisual apparatus, wherein it comprises a display device and an acoustic enclosure comprising a box, on which is mounted at least one electro-acoustic transducer, and a vent which together with the box produces a bass-reflex system wit a specified bass-reflex resonant frequency, the vent comprising an aperture and means of attenuation at said bass-reflex resonant frequency, the vent including at least one flexible plate.

* * * * *